(12) United States Patent
Deshpande et al.

(10) Patent No.: US 7,893,713 B2
(45) Date of Patent: Feb. 22, 2011

(54) MIXED SIGNAL INTEGRATED CIRCUIT

(75) Inventors: Amrita Deshpande, Chandler, AZ (US); Mika Benedykt, Albuquerque, NM (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/573,861

(22) PCT Filed: Aug. 11, 2005

(86) PCT No.: PCT/IB2005/052669

§ 371 (c)(1),
(2), (4) Date: May 21, 2008

(87) PCT Pub. No.: WO2006/018801

PCT Pub. Date: Feb. 23, 2006

(65) Prior Publication Data

US 2008/0258766 A1    Oct. 23, 2008

Related U.S. Application Data (60) Provisional application No. 60/602,140, filed on Aug. 17, 2004, provisional application No. 60/656,422, filed on Feb. 25, 2005.

(51) Int. Cl.
*H03K 19/173* (2006.01)
*H03L 7/00* (2006.01)
(52) U.S. Cl. .......................... 326/46; 327/161
(58) Field of Classification Search ......... 327/156–163; 326/46
See application file for complete search history.

(56) References Cited

U.S. PATENT DOCUMENTS

| | | | | |
|---|---|---|---|---|
| 4,473,878 A | * | 9/1984 | Zolnowsky et al. | 711/208 |
| 4,477,871 A | * | 10/1984 | Keshlear | 711/154 |
| 4,488,256 A | * | 12/1984 | Zolnowsky et al. | 711/210 |
| 4,740,891 A | | 4/1988 | Kirkpatrick et al. | |
| 4,841,390 A | * | 6/1989 | Yokosawa | 360/77.14 |
| 4,902,965 A | * | 2/1990 | Bodrug et al. | 324/116 |
| 5,179,705 A | * | 1/1993 | Kent | 710/241 |
| 5,359,635 A | * | 10/1994 | Atriss et al. | 377/39 |
| 5,426,772 A | | 6/1995 | Brady et al. | |
| 5,627,797 A | * | 5/1997 | Hawkins et al. | 365/221 |
| 5,764,712 A | * | 6/1998 | Branstad et al. | 375/376 |
| 5,844,423 A | * | 12/1998 | Narayana et al. | 326/46 |
| 5,963,056 A | * | 10/1999 | Narayana et al. | 326/96 |
| 5,994,920 A | * | 11/1999 | Narayana et al. | 326/46 |
| 6,067,648 A | * | 5/2000 | Hunter et al. | 714/718 |
| 6,239,626 B1 | | 5/2001 | Chesavage | |
| 6,351,168 B1 | * | 2/2002 | Li et al. | 327/160 |
| 6,453,425 B1 | * | 9/2002 | Hede et al. | 713/501 |

(Continued)

*Primary Examiner*—James H. Cho
*Assistant Examiner*—Matthew C Tabler (57) ABSTRACT

This invention relates to mixed signal integrated circuits, that is, integrated circuits comprising both analog and digital circuitry. More particularly, it concerns reduction of noise in such a device. When a digital circuit is included in the same integrated circuit device as an analog circuit, the digital circuit may be an additional source of a considerable amount of noise. This results in cross-talk, electrical interference and signal distortion imposed on the analog signals. The invention provides an integrated circuit comprising analog circuitry (26) and digital circuitry (29, 30) wherein the digital circuitry includes an ASM (30). An ASM does not require a clock signal. Its operation is triggered by appropriate input conditions, but in contrast to an SSM it is idle when there in no change in its inputs, lowering the level of noise generated by the digital circuitry.

10 Claims, 12 Drawing Sheets

U.S. PATENT DOCUMENTS

| | | | |
|---|---|---|---|
| 6,621,353 B2 * | 9/2003 | Bronson et al. | 331/1 A |
| 6,806,750 B1 * | 10/2004 | Rasmussen et al. | 327/156 |
| 6,856,202 B2 * | 2/2005 | Lesso | 331/1 A |
| 6,879,195 B2 * | 4/2005 | Green et al. | 327/147 |
| 7,439,812 B1 * | 10/2008 | Lombaard et al. | 331/1 A |
| 2004/0041605 A1 * | 3/2004 | Kizer | 327/159 |
| 2008/0258766 A1 * | 10/2008 | Deshpande et al. | 326/46 |

* cited by examiner

MIXED SIGNAL INTEGRATED CIRCUIT

The present invention relates to mixed signal integrated circuits, that is, integrated circuits comprising both analogue and digital circuitry. More particularly, it concerns reduction of noise in such a device.

Mixed signal integrated circuit devices are becoming increasingly widely used. This is due to the relatively low cost of manufacturing such a device in comparison to separate analogue and digital devices, together with their ability to provide high performance analogue functions built into a cost-effective digital manufacturing process. Such devices are employed in a wide range of electronic applications, including consumer electronics, computing, medical equipment and games systems.

It is known that a major source of signal disturbance in mixed signal devices is noise generated by the digital circuitry. Noise may be defined as unwanted, random and extraneous signals that may be present in addition to a desired signal in an electronic circuit. Noise may cause circuits to operate in an unexpected manner. If a circuit has been designed to respond to a signal of a certain amplitude and frequency, and if these two parameters of the signal change due to the presence of noise, the circuit may respond to this new signals in a different way. The device does not therefore function according to its prescribed specification, making it unreliable.

When a digital circuit is included in the same integrated circuit device as an analogue circuit, the digital circuit may be an additional source of a considerable amount of noise. The sources of noise in a digital circuit are switching digital signals and switching in the power supply current due to sporadic changes in the signals. This disturbance may be coupled to the analogue circuitry via internal power rails, or where the analogue and digital circuitry share a common substrate, via the semiconductor substrate of the device. This results in cross-talk, electrical interference and signal distortion imposed on the analogue signals.

Figure 1:
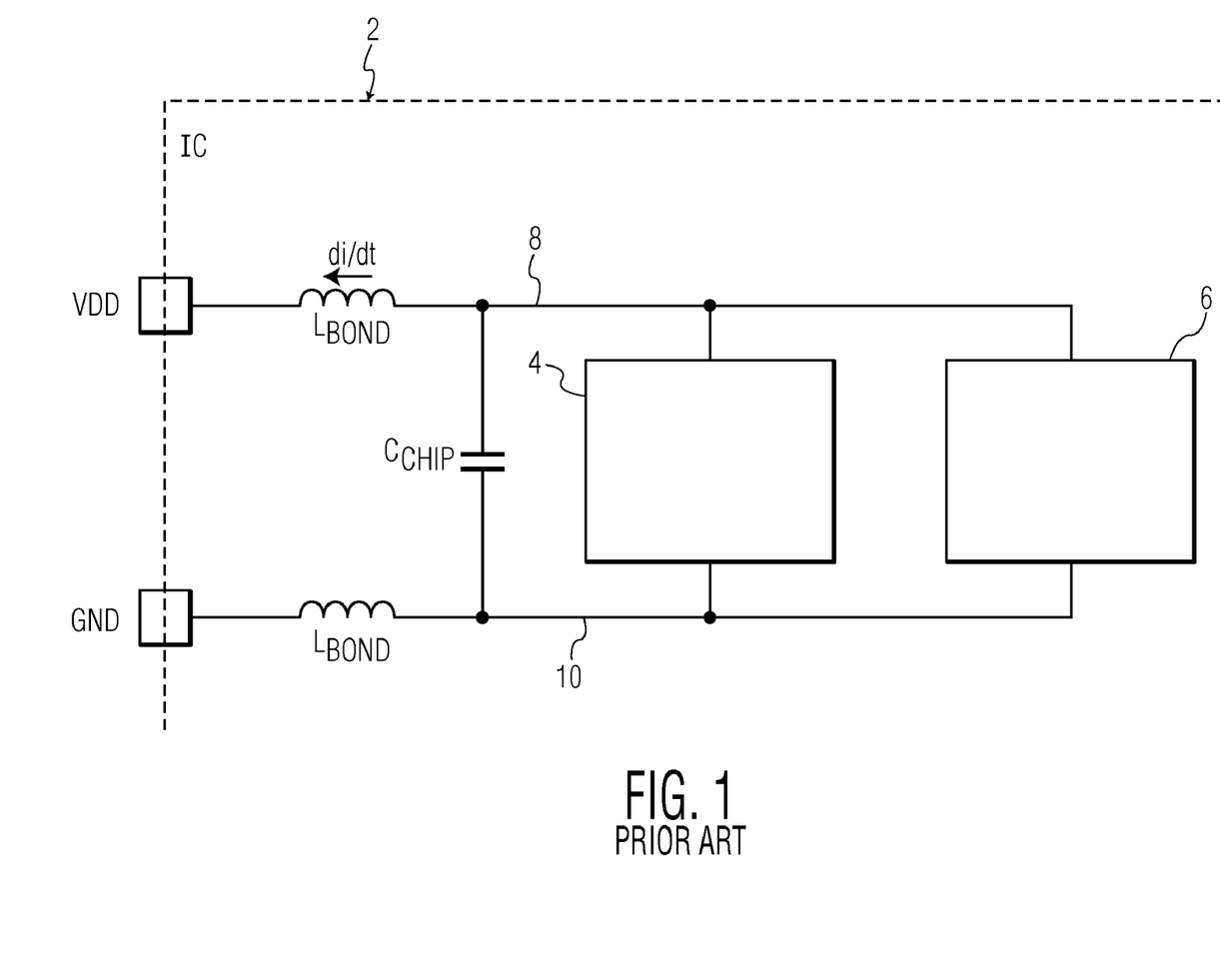
FIGS. 1 and 2 show circuit diagrams of known mixed signal integrated circuit devices.

FIG. 1 illustrates a configuration of an integrated circuit device 2, in which digital circuitry 4 and analogue circuitry 6 share a common power supply rail 8. The inductance $L_{BOND}$ represents the inductance of bond wires extending from the semiconductor die to respective pins of the integrated circuit device, whilst capacitance $C_{CHIP}$ represents the total die capacitance as seen from the internal power supply terminals in the blocks connected to these terminals. Switching within the digital circuitry may generate sharp changes in the current with time (large di/dt) on positive supply rail 8 (relative to ground rail 10) which may cause an oscillatory response due to the package inductances $L_{BOND}$.

Figure 2:
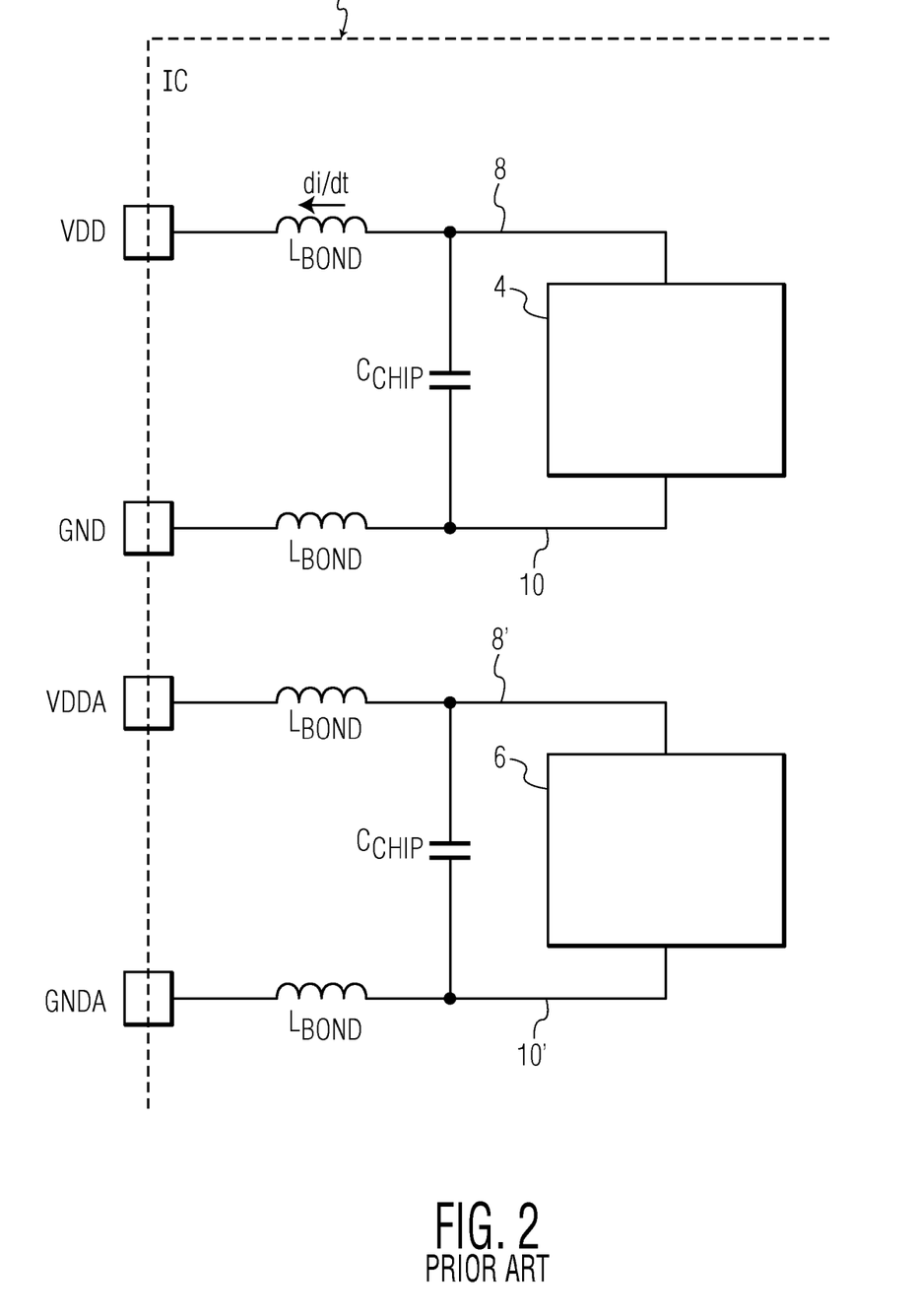

In the integrated circuit device 2 shown in FIG. 2, the digital circuitry 4 and analogue circuitry 6 are provided in separate domains on a common semiconductor substrate. The analogue circuitry has separate supply rails 8' and 10'. However, disturbance from the digital circuitry is coupled through the substrate into the analogue circuitry causing the problems discussed above.

Prior attempts to address these problems have included supporting a flat impedance of the internal power rails across broadband frequencies by adequate internal decoupling, or controlling a current slew rate of the switching networks resulting in lower di/dt. Arranging the layout of the device to minimise parasitic coupling and appropriate placement and biasing of the guard rings may further reduce interference problems.

A more radical approach is to only use circuit configurations which are relatively insensitive to noise. However, these measures may affect the analogue circuit design significantly, making it substantially more costly and difficult to implement.

There remains a widespread need for another approach by which to reduce these interference problems.

The present invention provides an integrated circuit comprising analogue circuitry and digital circuitry wherein the digital circuitry includes an asynchronous state machine (referred to as "ASM" below).

In some existing integrated circuit designs, a synchronous state machine (referred to as "SSM" below) is used to control operation of the device. In particular, the state machine defines a logical sequence of events that need to take place in order for a group of operations to be completed by the device. In an SSM, the events of this logical sequence occur at regular intervals, that is, at every clock cycle of a global synchronising clock. The inputs of the SSM are sampled at every clock cycle to check for any change therein and the appropriate input conditions to trigger operation of the SSM. The inventors have realised that the presence of a global clock signal is a substantial source of noise which may interfere with the analogue circuitry of the device.

An ASM does not require a clock signal. Its operation is triggered by appropriate input conditions, but in contrast to an SSM it is idle when there is no change on its inputs. Once the ASM has been triggered, it goes through a sequence of events and then generates a "completion" signal to indicate it is ready to carry out further operations.

The invention is particularly applicable to mixed signal integrated circuits in which the input vector (that is, the plurality of inputs to the state machine) is operating at low frequencies. That is because the noise reduction provided by the use of an ASM is more substantial when the inputs are changing less frequently as the level of activity of the digital circuitry will be lowered, making the absence of a clock signal more marked.

In a preferred embodiment the integrated circuit includes an input latching circuit for detecting a change in the inputs to the ASM. Provision of a circuit that automatically detects change in the inputs, rather than using a polling or sampling circuit involving periodic monitoring of the inputs allows a further reduction in the amount of switching occurring in the digital circuitry. The input latching circuit may be arranged to trigger transition of the ASM from one state to another when a change in the inputs to the ASM has been detected.

Preferably, the input latching circuit is arranged to receive an input signal indicative of whether the ASM is ready for transition to another state. In this way, the input latching circuit may delay triggering transition of the ASM to another state until the ASM has become inactive following a response to the previous trigger signal.

The flag generation circuit may comprise a plurality of programmable delay cells (referred to as "PDCs" below).

In a further preferred implementation, the ASM includes a flag generation circuit comprising a flag regeneration circuit for restoring the width of a flag pulse to counteract a reduction in its width caused elsewhere in the flag generation circuit. Maintenance of the flag pulse width may be important as the ability to "recirculate" pulses inside the state machine is beneficial in reducing the number of PDCs governing the flag generation circuit. Re-use of PDCs for multiple sequences of state and output changes may be facilitated.

Where analogue and digital circuitry are provided on a common semiconductor substrate in an integrated circuit device, the present invention may serve to reduce the amount of interference coupled from the digital to the analogue circuitry through the substrate.

In a preferred embodiment, the ASM forms part of a PLL clock buffer.

An embodiment of the invention will now be described by way of example and with reference to the accompanying schematic drawings, wherein.

Figure 3:
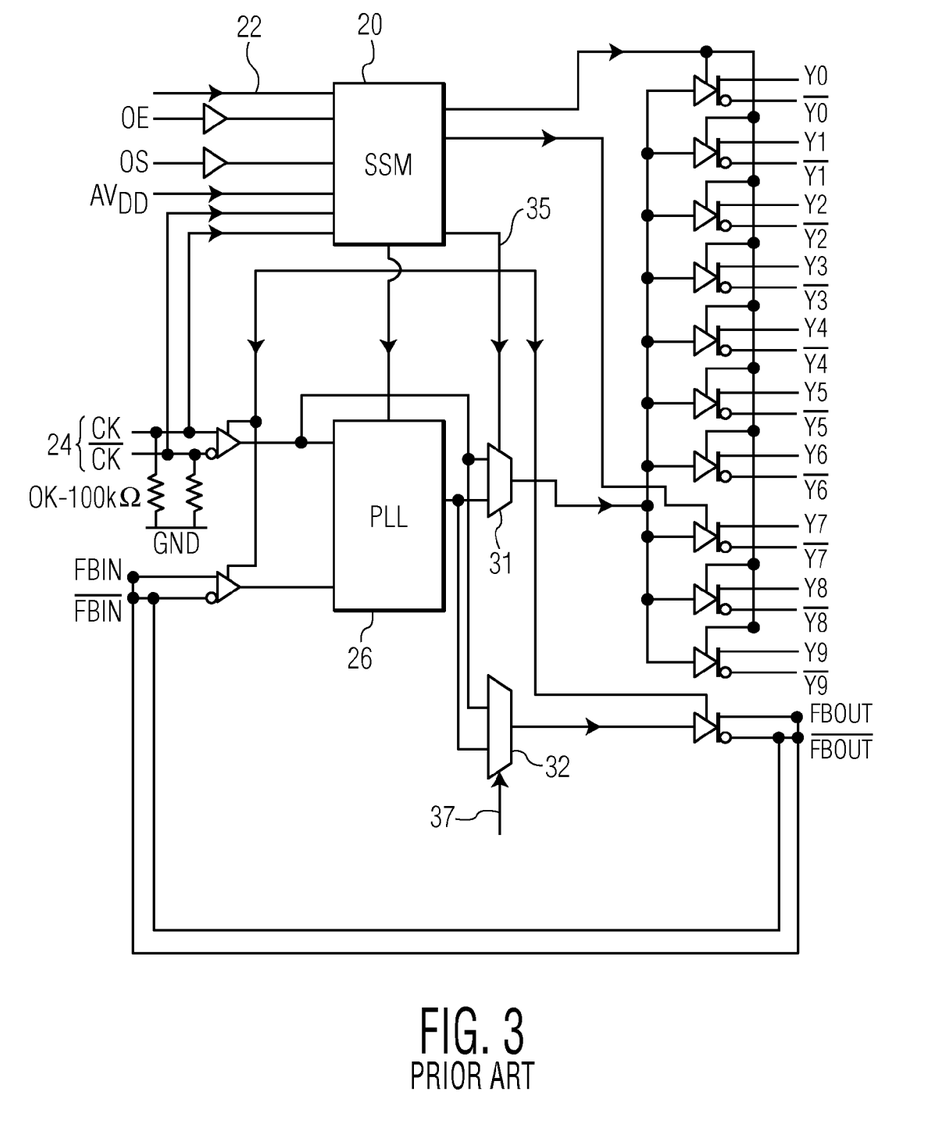
FIG. 3 shows a block diagram of a known PLL clock buffer circuit.
Figure 4:
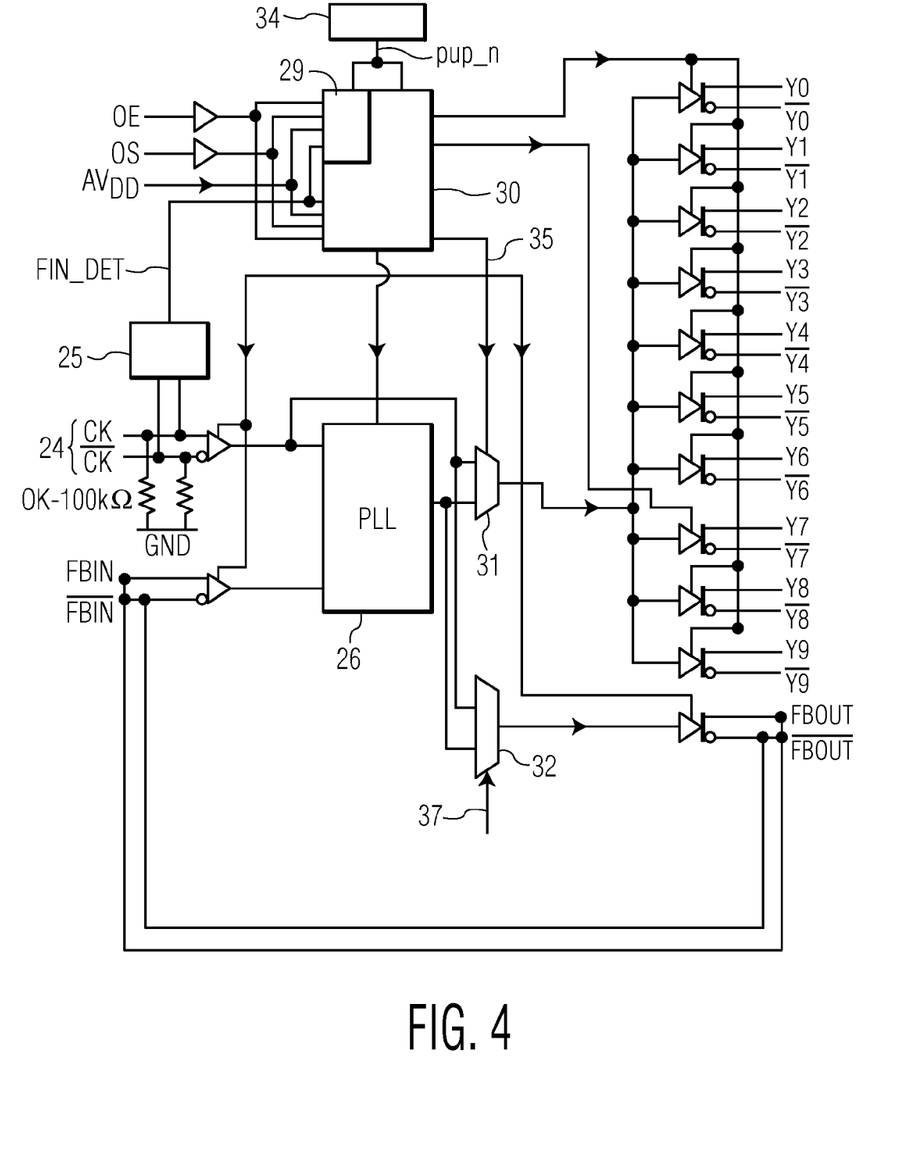
FIG. 4 shows a logic diagram of a PLL clock buffer circuit according to an embodiment of the invention.

The PLL clock buffer circuit shown in FIG. 3 is based on a JEDEC standard specification of such a circuit for registered DDR2 DIMM Applications (JESD82-11) and so its configuration and operation will not be described in detail here. FIG. 4 shows a modified version of this circuit, according to an embodiment of the invention.

In the known circuit of FIG. 3, the SSM requires an external clock signal along input line 22. In contrast, in the embodiment of the invention shown in FIG. 4, the SSM 20 is replaced by an input latcher 29 and ASM 30, and the clock signal is no longer required, thereby removing a significant source of interference with digital circuitry in the integrated circuit.

The PLL clock buffer circuit distributes a differential clock input pair 24 to ten differential clock outputs, Y0 to Y9 and their inverses. The clock outputs are controlled by four input signals, namely the positive power supply, $AV_{DD}$, "output enable", OE, "output select", OS, and frequency input, FIN_DET. FIN_DET is derived from input pair 24 by clock detector circuit 25.

PLL 26 is an analogue, noise-sensitive circuit, whilst the digital circuitry of the input latcher 29 and ASM 30 controls the clock outputs as well as the turning on and off of the PLL.

Power-on circuit 34 generates a signal ("pup_n") whilst the buffer circuit is powering up which is used to initialise all the internal flip-flops of input latcher 29 and ASM 30.

The digital circuitry of the arrangement shown in FIG. 4 operates to detect a change in any of the inputs, transition into its next state, and generate the appropriate outputs in that state. The ASM fulfils the latter two functions whilst the input latcher achieves the former. The ASM performs its functions in multiple phases. In the first phase, it transitions to the correct state. At the end of the state transition, it generates a flag to indicate this (identified as "flg_sm" in relation to FIG. 7 below). Then the state machine uses the current state information and generates the correct outputs. At the end of this phase, it updates the outputs.

The next phase is a "wait" phase in which the ASM waits the time period it takes the outputs to settle before going back to the first phase of state transition. The state machine continues in this manner until all the state transitions for the particular change in inputs concerned are completed, and then it generates a completion flag (identified as "sm_done" in FIGS. 6 and 7 below).

In addition, a differential pair of feedback outputs (FBOUT and its inverse) is provided, which feeds back into the PLL 26. These outputs put out either the PLL clock, if the PLL is on, or the input frequency, if the PLL is off and the input frequency is present. This is controlled and determined by the PLL by-pass multiplexor 31 according to a control signal from the ASM along line 35. A feedback multiplexor 32 chooses the frequency outputted on the feedback output FBOUT. Similarly, it selects either the PLL frequency or the input frequency according to a control signal from the ASM along line 37.

There are a total of ten clock outputs according to the JEDEC specification JESD82-11, namely Y0-Y6, Y8 and Y9 (collectively referred to below as YX); and Y7.

The OE and OS inputs control the output buffers as follows:

OE=L, OS=L: YX=disabled, Y7=enabled, FBOUT=enabled;

OE=L, OS=H: YX=disabled, Y7=disabled, FBOUT=enabled;

OE=H, OS=X: YX=enabled, Y7=enabled, FBOUT=enabled.

The AV and FIN_DET inputs control the circuit operation as follows:

AV=1, FIN_DET=present: In this mode, the PLL is on. The PLL is in the not-bypassed mode. The feedback is in the not-bypassed mode. The PLL clock frequency is sent out on all the outputs (YX, Y7, FBOUT) based on the values of OE and OS;

AV=1, FIN_DET=absent: In this mode, the PLL is turned off, and the whole block goes into the power-down mode. The PLL bypass multiplexor is in the bypass mode, that is, the PLL clock frequency does not go out on the output buffers. The feedback multiplexor is also in the bypass mode. All the outputs (YX, Y7, FBOUT) are disabled;

AV=0, FIN_DET=present or absent: In this mode, the PLL is turned off. The PLL bypass multiplexor is in the bypass mode, that is, the PLL clock frequency does not go out on the output buffers but the input clock frequency, if present goes out on the outputs. The feedback multiplexor is also in the bypass mode. The outputs (YX, Y7, FBOUT) are controlled by OE and OS.

Figure 5:
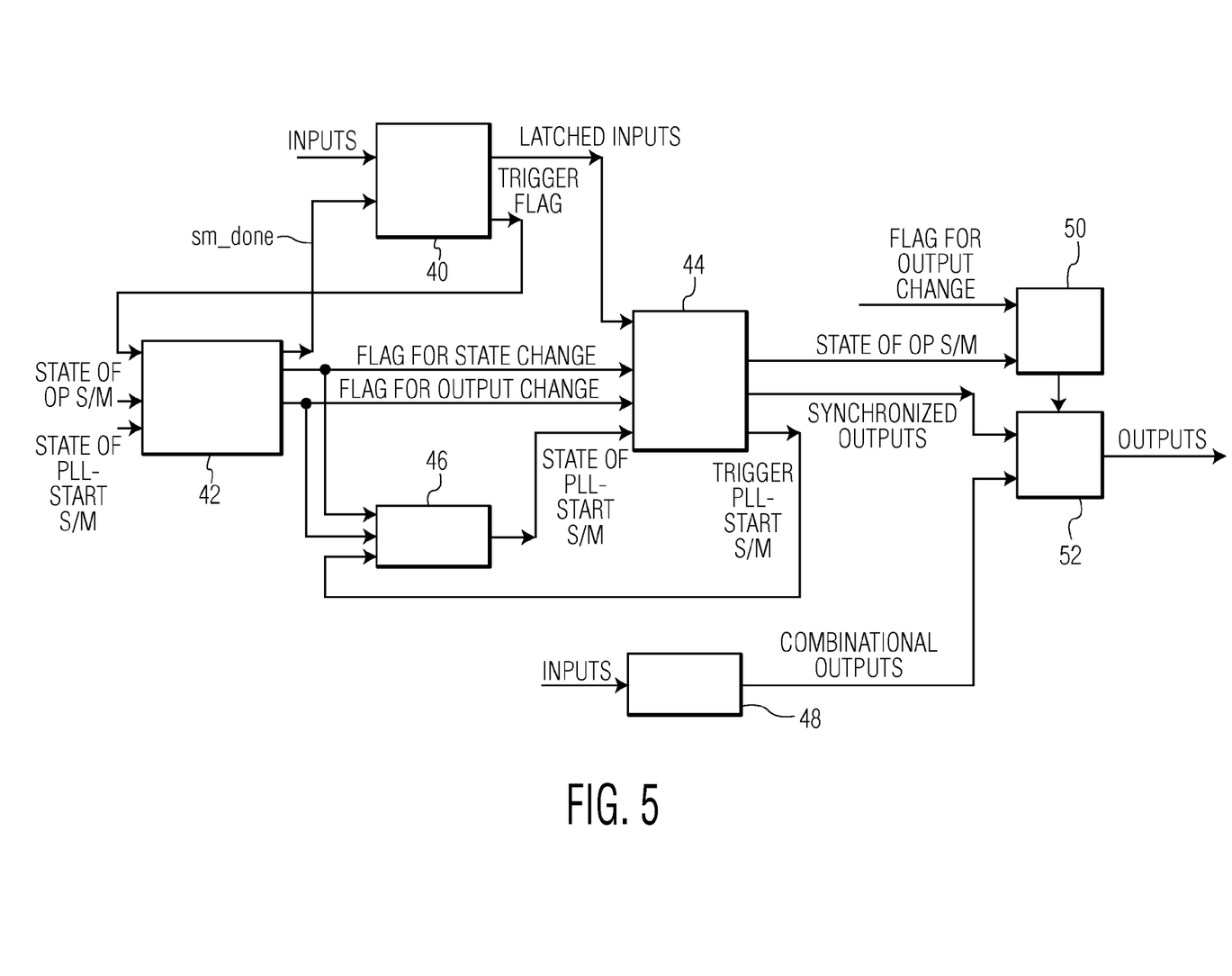
FIG. 5 shows a block diagram of the ASM of FIG. 4.

A block diagram of the digital control circuitry employed in the PLL clock buffer circuit of FIG. 4 is shown in FIG. 5. In particular the ASM 30 of FIG. 4 consists of the following blocks:

Input Latcher 40;
Flag Generation Circuit 42;
Output Management State Machine 44;
PLL Start State Machine 46;
Combinational Block 48; and
Output Multiplexor 52 and Selector 50.

These blocks will be described briefly below and then in turn in more detail.

The Input Latcher 40 latches any change in the inputs to the PLL clock buffer circuit. This change may cause the ASM to trigger. Otherwise, the ASM is idle.

The Flag Generation Circuit 42 is a daisy chain of programmable delay cells with some gating logic. This block generates a finite number of flag pulses required to complete the events of the state machine.

The Output Management State Machine 44 along with the PLL Start State Machine 46 control the output buffers as well as the switching on or off of the PLL. Whenever any of the inputs change, it affects the state of the PLL and the output buffers. When the PLL goes from the OFF state to the ON state, it is necessary to ensure that the outputs are not enabled until the PLL is ready and outputting a clock. This is ensured by using both the Output Management State Machine and the PLL Start State Machine.

The Combinational Block 48 allows the outputs to change directly in response to the inputs under certain conditions (without involvement of the Output Management State Machine 44). There may be a timing constraint/specification requirement as to how soon the output changes after the input OE changes. This path is allowed when the state machine is transitioning between one of the following states, (1,2), 3, 4, 5, 6, (7,8), as defined below. Any time the state machine transitions from state (9,10) to any of the other states, the change in the outputs is synchronized to either the PLL or the input frequency or, if neither are present, the internal flags used in the ASM. This is to ensure that as the part is powering up, there is no glitching on the outputs.

The Output Multiplexor 52 and Selector 50 choose the outputs from the Combinational Block 48 and the State Machine block 44 as seen in FIG. 10.

Input Latcher

Figure 6:
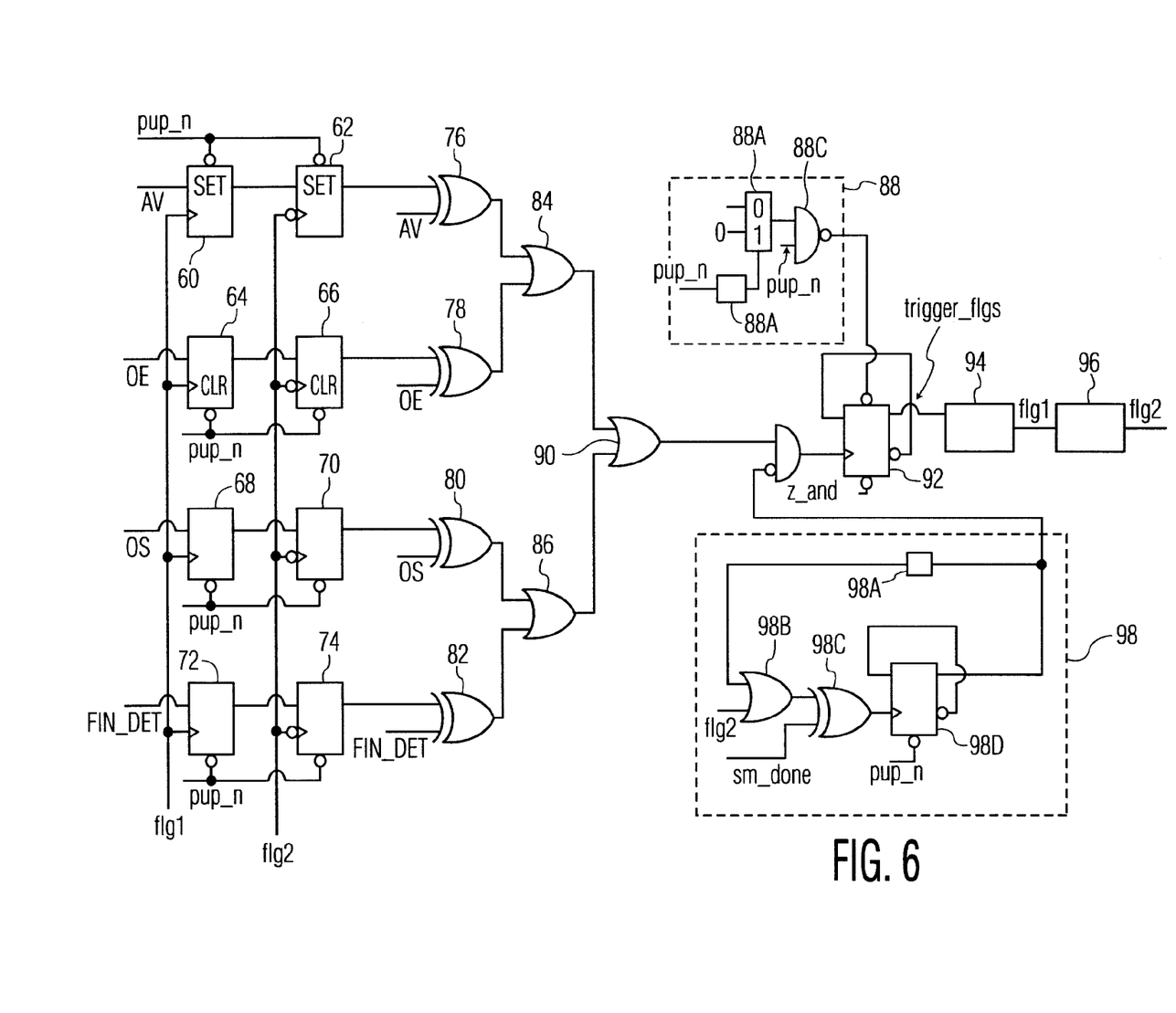
FIG. 6 shows a block diagram of the input latching circuit shown in FIG. 5.

The Input Latcher circuit 40 is shown in more detail in FIG. 6. It latches a change in any of the input signals. It then triggers the ASM.

There are four input signals, AV, OE, OS and FIN_DET. Each of these four input signals goes through two flip-flops (60, 62; 64, 66; 68, 70; 72, 74) in series. The first flip-flop (60, 64, 68, 72) is triggered by the front-end of a pulse called "flg1" and latches in the external input signal. The second flip-flop (62, 66, 70, 74) is clocked by the different, back-end of a pulse called "flg2" and latches in the output of the first flip-flop. "flg1" and "flg2" are separated by a delay. The time difference between the first pulse on "flg1" and the pulse "flg2" ensures that the first flip-flop has settled to a defined state before the second one is initialised. This two-flop section is required to prevent the propagation of a metastable state into the ASM. These Input Latcher flip-flops for AV, OE, OS and FIN_DET are assumed to have the values of 1, 0, 0, 0 respectively, on power up.

Each input goes through an XOR gate (76, 78, 80, 82) which compares the system input (one of AV, OE, OS and FIN_DET) to the output of the second flip-flop at the front-end of the Input Latcher block. The output of the XOR gate will be HIGH (logic 1) if any of the inputs differ from their power-on/latched values. OR gates 84, 86, 90 combine the outputs of XOR gates 76, 78, 80, 82 to generate one signal that is used in further circuitry.

In case any of the inputs are different from their assumed power-on or currently latched values, a rising edge triggered flag signal (z_and) is generated to trigger a flip-flop 92. The output of this flip-flop triggers a pulse generator 94. Pulse generator 94 may consist of an XOR gate with one input connected to the pulse generator input and its other input connected to the pulse generator input via a delay circuit. The pulse generator is triggered by the transition (either a high to low or low to high) on "trigger_flgs", which, in turn, generates an active high pulse, which goes through a programmable delay cell 96 and triggers the flag generation circuit. If the input pins are the same as the power-on/latched values, then the ASM stays idle, until an input changes.

There is special circuitry 88 provided to take care of the Input Latcher stage during power-up. It consists of a multiplexor 88A, a 1 nanosecond delay cell 88B and a NAND gate 88C. While the circuit is powering up, the states of all the internal signals are undefined. The states of the internal signals are defined only after the power-up sequence is completed. It is possible that during power-up, a clock on "z_and" goes unnoticed, because the asynchronous clear signal on the "trigger_flgs" flip-flop 92 is active at the same time. This would prevent the ASM from being triggered after power-up and consequently, it would be in the wrong state. The "trigger_flgs" flip-flop has an asynchronous set input. It is asserted after the power-on sequence is completed, and if there is a difference in the external inputs and their corresponding power-on default values. In this way, the ASM will be triggered for the first time after the power-up.

There is another special circuit 98 included that prevents the ASM from triggering while it is active. "z_and" will be disabled until the "sm_done" signal is received. It consists of a delay cell 98A, OR gate 98B, XOR gate 98C and flip-flop 98D. The "sm_done" signal is the completion signal received from the ASM when it is finished doing its work.

Flag Generation Circuit

Figure 7:
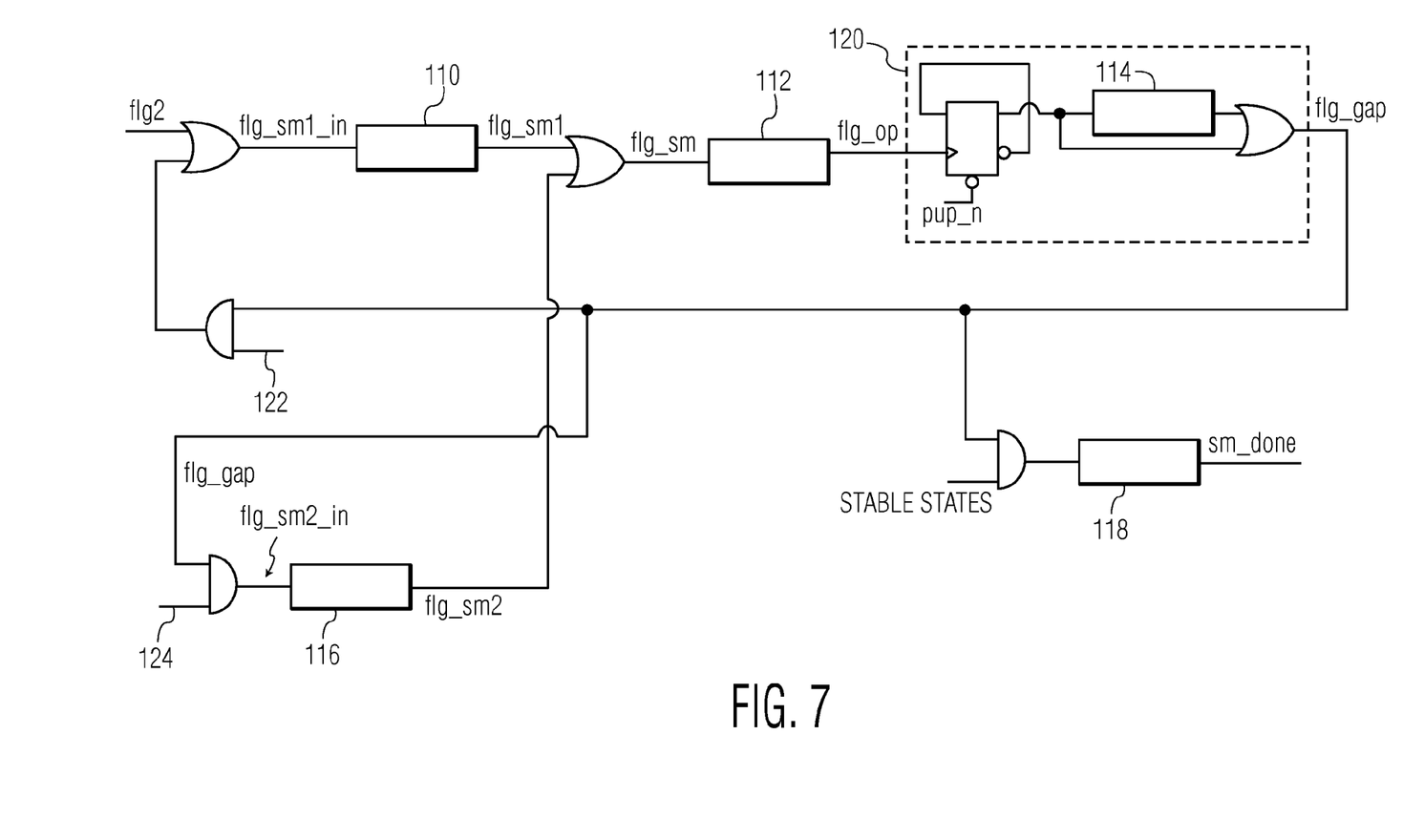
FIG. 7 shows a block diagram of the flag generation circuit shown in FIG. 5.

This circuit partitions the ASM into multiple phases.

Update of States

Update of the Outputs

Re-generation of the flag used for the update of the states and outputs.

The Flag Generation Circuit consists of five programmable delay cells (PDCs), 110, 112, 114, 116, 118.

The first PDC 110 is used to mark the time interval for the asynchronous state machine to go to its next state. The end of "flg_sm1", which is an active high pulse, indicates that the state transition is completed.

The second PDC 112 is used to mark the time interval for the outputs to be enabled/disabled. The end of "flg_op", which is an active high pulse, indicates that the output enablement/disablement is completed.

The third PDC 114 forms part of a flag regeneration circuit 120, and is used to re-generate these flags, which tend to lose their width when going through these PDCs. The pulse "flg_gap" outputted by PDC 114 is used to create a delay to let the output changes settle before the state machine moves on to the next state.

The fourth PDC 118 is used to generate the "sm_done" signal that is an indication of the completion of all the state transitions for a given change in inputs by the ASM.

The fifth PDC 116 is used in certain states, bypassing the PDC 110, for state changes. This applies to those state transitions which take a different time constant for completion than the ones that use the PDC 110. Selection of PDC 110 or 116 depending on the state concerned is achieved using AND gate inputs 122 and 124, respectively.

Output Management State Machine

Figure 8A:
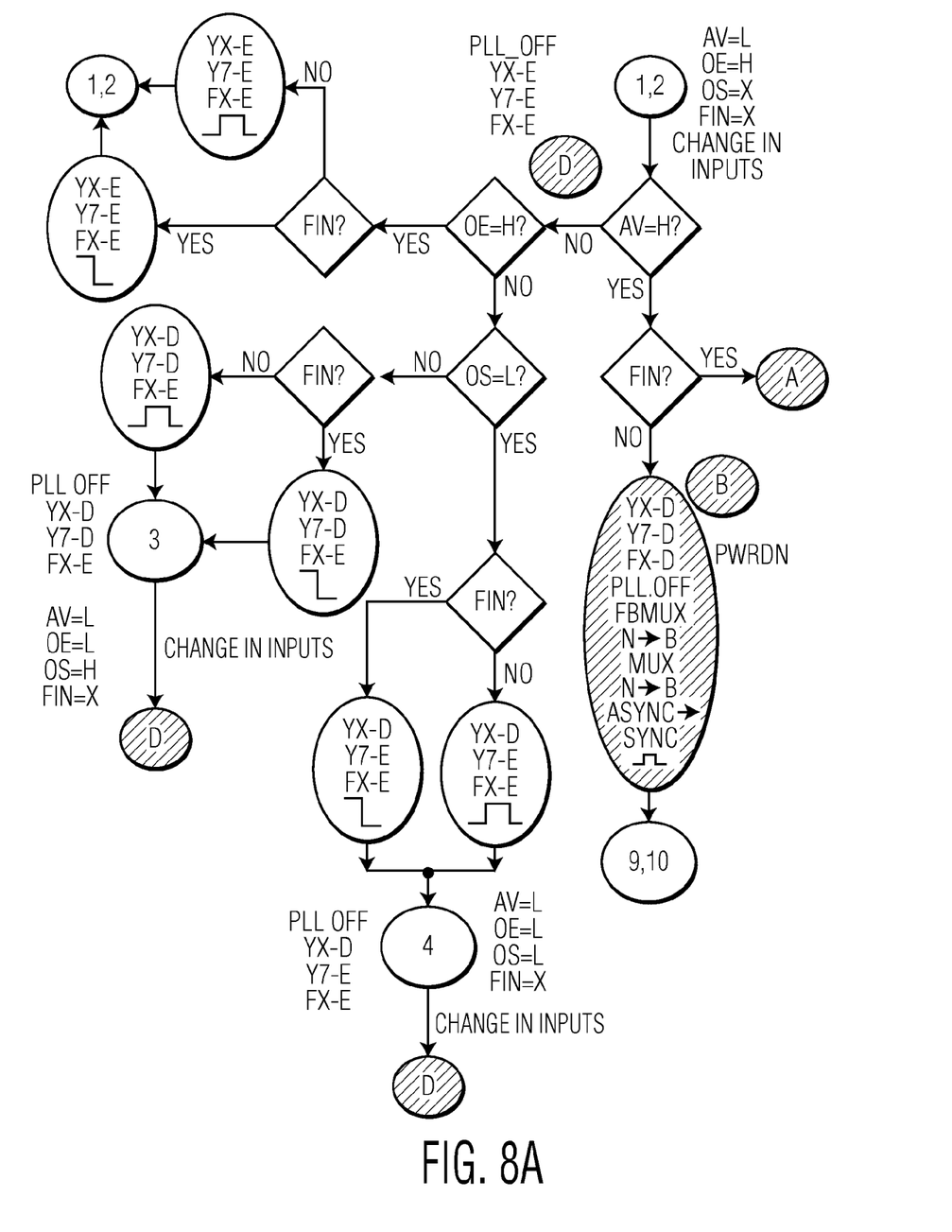
FIGS. 8A to 8D show flow charts illustrating operation of the Output Management State Machine shown in FIG. 5.
Figure 8B:
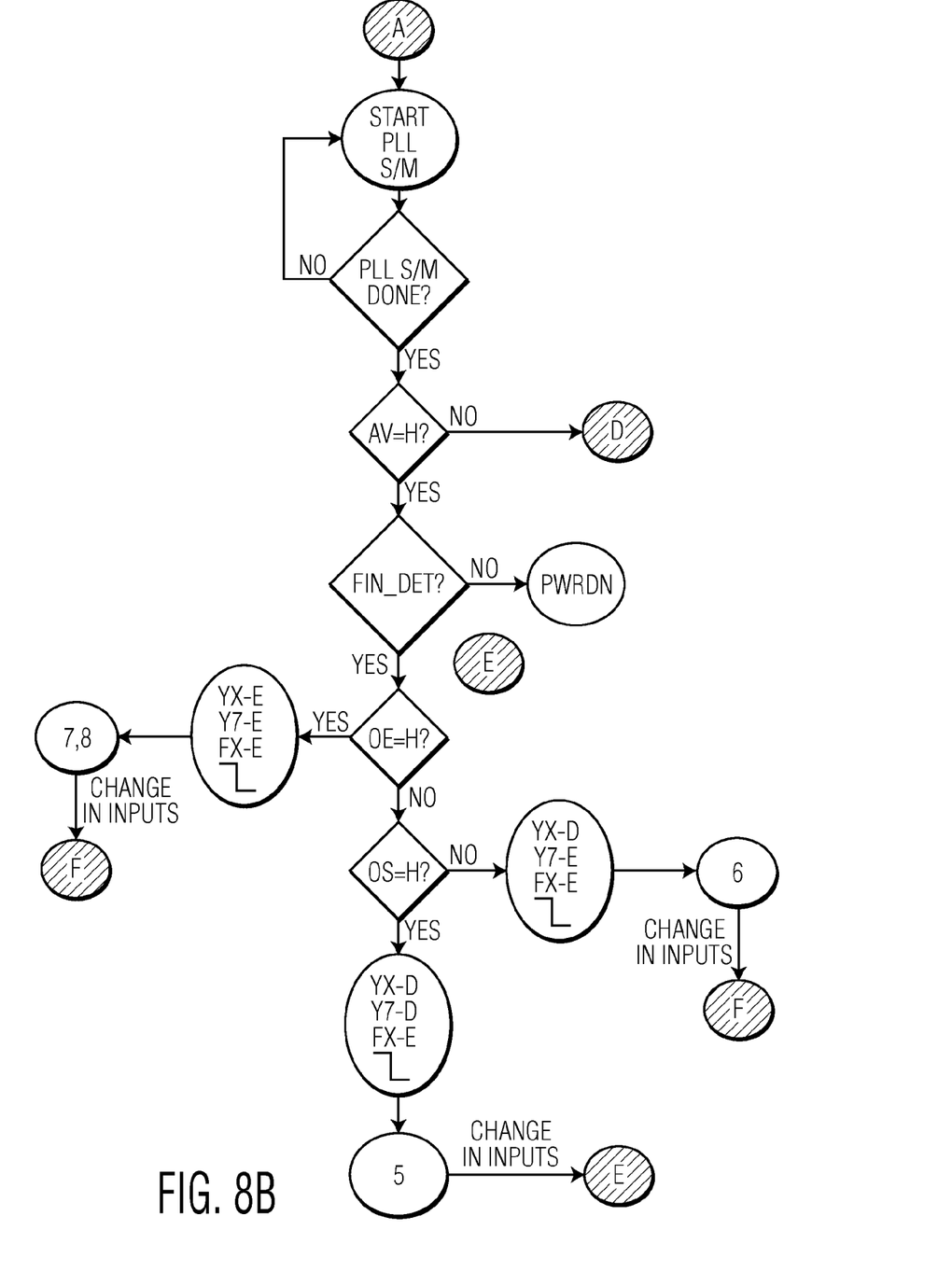
Figure 8C:
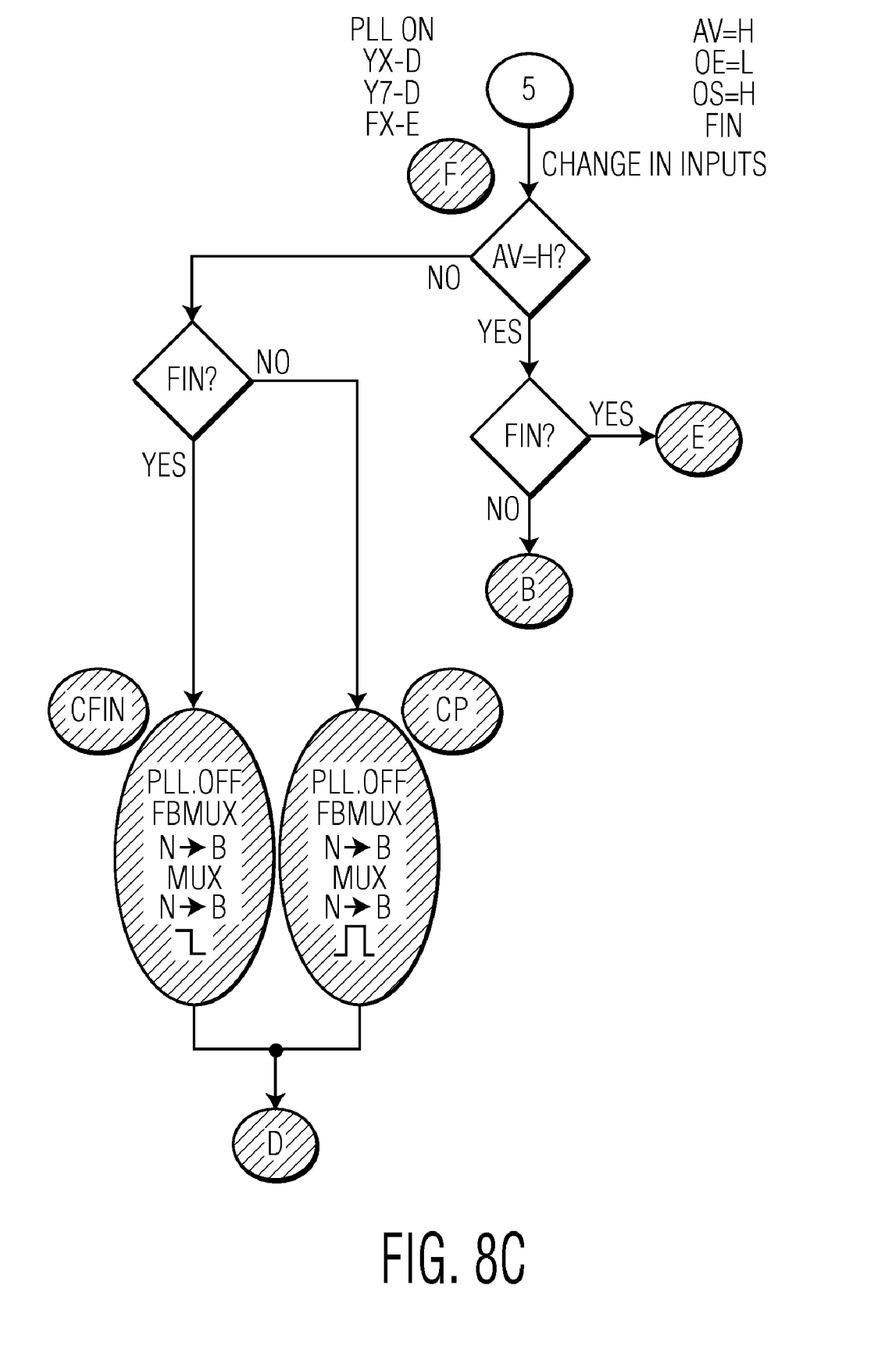
Figure 8D:
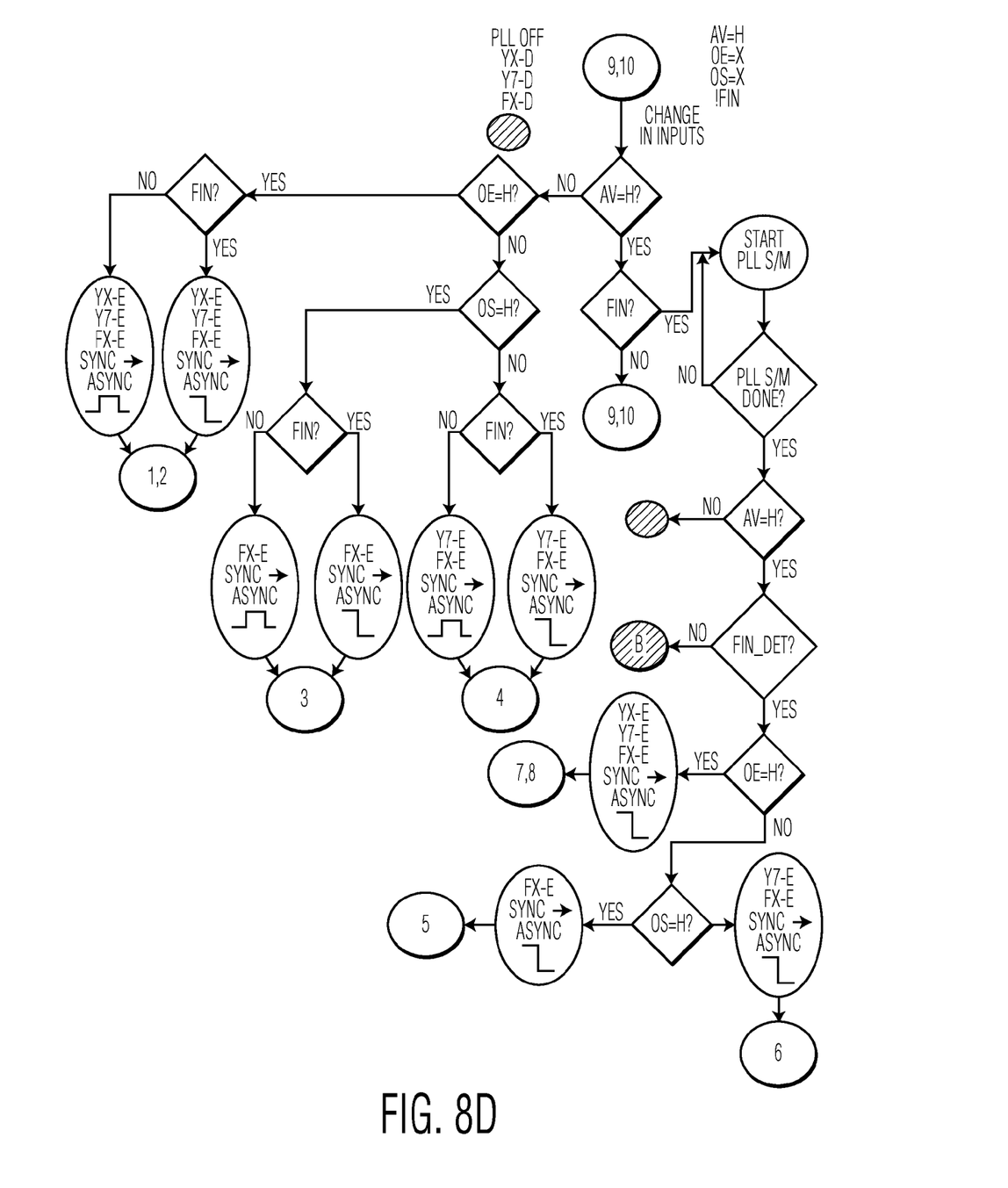

Flow charts illustrating operation of the Output Management State Machine are shown in FIGS. 8A to 8D. FIG. 8A shows its operation beginning from start state 1, 2 and FIG. 8B is a continuation of FIG. 8A; FIG. 8C shows operation from start state 5; and FIG. 8D shows operation from start state 9, 10.

This state machine keeps track of the input signals and the state of the PLL and the output buffers and ensures that the proper sequence of events occur for the PLL to start and then for the output buffers to be enabled/disabled.

It is initialised to state (9,10), the power-down state. There are seven more possible states, these states have unique input conditions and specific outputs:

(1,2)—AV=L, OE=H, OS=don't care, FIN_DET=don't care;
  YX=enabled, Y7=enabled, FX ("FBOUT" above)=enabled;
3—AV=L, OE=L, OS=H, FIN_DET=don't care;
  YX=disabled, Y7=disabled, FX=enabled;
4—AV=L, OE=L, OS=L, FIN_DET=don't care;
  YX=disabled, Y7=enabled, FX=enabled;
5—AV=H, OE=H, OS=don't care, FIN_DET=present;
  YX=disabled, Y7=disabled, FX=enabled;
6—AV=H, OE=L, OS=L, FIN_DET=present;
(7,8)—AV=H, OE=L, OS=H, FIN_DET=present;
  YX=enabled, Y7=enabled, FX=enabled;

Group A: State (9,10)

Group B: States (1,2), 3 and 4 have AV=L and therefore the PLL is off.

Group C: States 5, 6, (7,8) have AV=H and FIN_DET=present and therefore the PLL is on.

State transitions within either group and between groups B and C can happen asynchronously with the change in the inputs. Although there could be synchronous output changes with respect to the internal events of ASM, in this state diagram, they are essentially bypassed due to the "async" signal. It is assumed that the inputs will change for the time it takes the state machine to complete its state transitions.

State transitions from any group to group A, means that the PLL is powered down.

State transitions from group B to group C means the PLL needs to start and the PLL Start State Machine is triggered.

PLL Start State Machine

Figure 9:
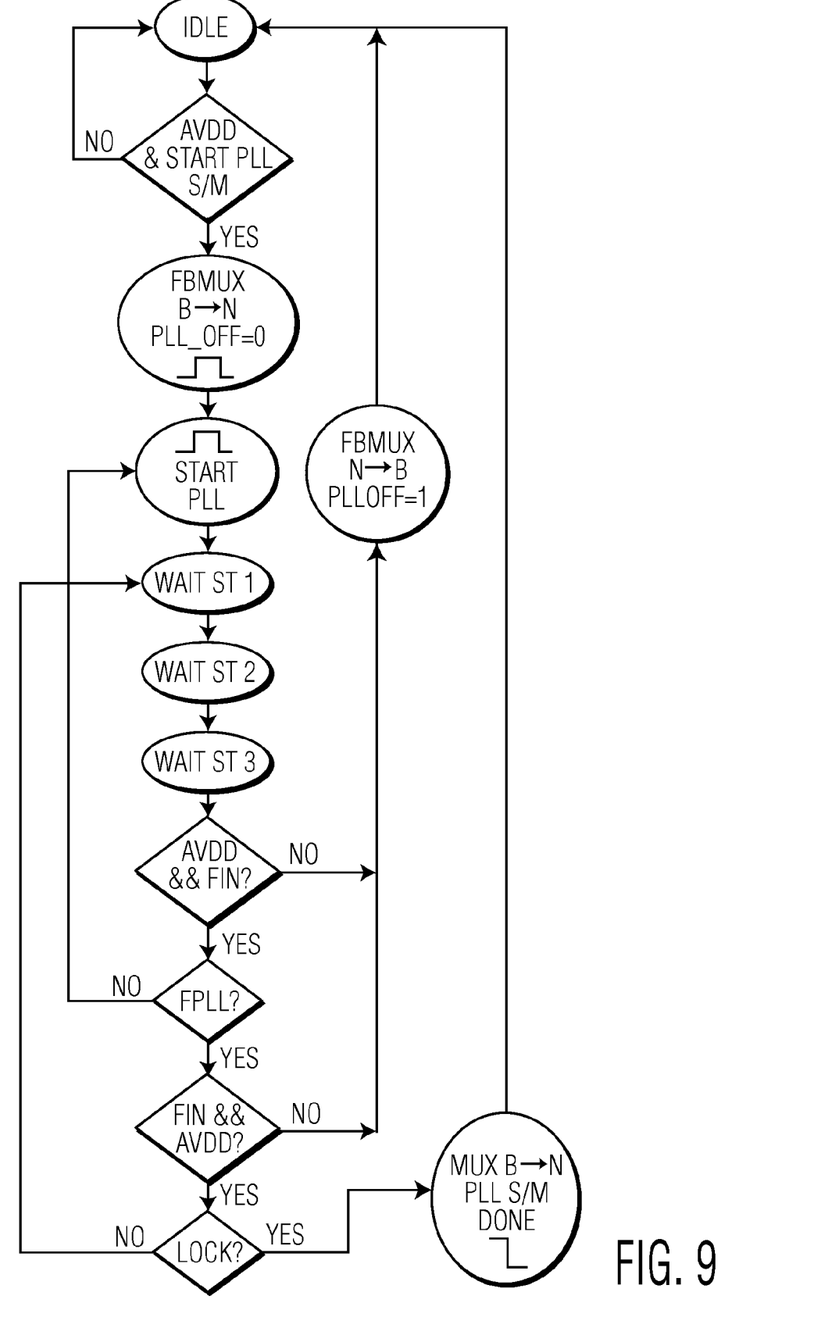
FIG. 9 shows a flow chart illustrating operation of the PLL Start State Machine shown in FIG. 5.

A flow chart illustrating operation of the PLL Start State Machine is shown in FIG. 9.

This state machine is triggered by the Output Management State Machine under two conditions. When there is transition from one of these three states (1,2) or 3 or 4 to 5 or 6 or (7,8) or when there is a transition from the power-down state (9,10) to 5 or 6 or (7,8).

This state machine first checks for the presence of the AV signal. If it is unasserted, this state machine does not get triggered.

It then puts the Feedback Multiplexor in the non-bypassed mode. This allows the PLL frequency to be fed back into the PLL circuit. It re-asserts the PLL-OFF signal.

It then generates the START-PLL signal. This is an active-high pulse which is used to start the PLL.

There are three wait states; the state machine waits for the PLL to start, it then checks for AV and the input frequency, FIN_DET. If either one of them are not present, the state machine goes back to idle mode, asserts PLL-OFF, and changes the feedback multiplexor from not-bypassed mode to bypassed mode.

It checks for the PLL frequency next. If there is no frequency at the output of the PLL, it re-kicks the PLL and continues onto the wait states.

If the PLL frequency is present, it re-checks for AV and FIN_DET. If neither are present, it does what it did before in that same case.

If FIN_DET and AV are present, the state machine checks for the PLL-LOCK condition. If the PLL is not locked, it goes back to the wait states, it does not re-kick the PLL. If the PLL-LOCK is present, then it means that the PLL is supplying the correct frequency. The state machine changes the bypassed mode on the PLL multiplexor to the not-bypassed mode. This means that the PLL frequency goes out onto the output buffers. The state machine then also generates the "PLL SM DONE" signal that indicates the completion of this state machine after which the ASM becomes idle.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. An integrated circuit comprising:
analog circuitry;
digital circuitry including an asynchronous state machine; and
an input latching circuit for detecting a change in one or more inputs to the asynchronous state machine;
wherein said asynchronous state machine controls an on or off state of the analog circuitry and controls outputs of the analog circuitry as a function of the change in the one or more inputs, and
wherein the asynchronous state machine includes a flag generation circuit comprising a plurality of programmable delay cells.

2. An integrated circuit of claim 1, wherein the input latching circuit is configured to trigger a first state transition of the asynchronous state machine when a change in the one or more inputs to the asynchronous state machine has been detected.

3. An integrated circuit of claim 2 wherein the input latching circuit is configured to receive an input signal indicative of whether the asynchronous state machine is ready for a second state transition.

4. An integrated circuit of claim 1, wherein the analog circuitry and digital circuitry are provided on a common semiconductor substrate.

5. An integrated circuit of claim 1, wherein the analog circuitry is a phase lock loop clock buffer.

6. An integrated circuit comprising:
analog circuitry;
digital circuitry including an asynchronous state machine; and
an input latching circuit for detecting a change in one or more inputs to the asynchronous state machine;
wherein said asynchronous state machine controls an on or off state of the analog circuitry and controls outputs of the analog circuitry as a function of the change in the one or more inputs, and
wherein the asynchronous state machine includes a flag generation circuit comprising a flag regeneration circuit for restoring the width of a flag pulse to counteract a reduction in its width caused elsewhere in the flag circuit.

7. An integrated circuit of claim 6, wherein the input latching circuit is configured to trigger a first state transition of the asynchronous state machine when a change in the one or more inputs to the asynchronous state machine has been detected.

8. An integrated circuit of claim 7, wherein the input latching circuit is configured to receive an input signal indicative of whether the asynchronous state machine is ready for a second state transition.

9. An integrated circuit of claim 6, wherein the analog circuitry and digital circuitry are provided on a common semiconductor substrate.

10. An integrated circuit of claim 6, wherein the analog circuitry is a phase lock loop clock buffer.

* * * * *